(12) United States Patent
Permana et al.

(10) Patent No.: US 8,183,149 B1
(45) Date of Patent: May 22, 2012

(54) METHOD OF FABRICATING A CONDUCTIVE INTERCONNECT ARRANGEMENT FOR A SEMICONDUCTOR DEVICE

(75) Inventors: David M. Permana, Fishkill, NY (US); Ravi P. Srivastava, Fishkill, NY (US); Haifeng Sheng, Beacon, NY (US); Dimitri R. Kioussis, White Plains, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 55 days.

(21) Appl. No.: 12/973,373

(22) Filed: Dec. 20, 2010

(51) Int. Cl.
*H01L 21/4763* (2006.01)

(52) U.S. Cl. . 438/623; 438/761; 438/780; 257/E21.575; 257/E21.597

(58) Field of Classification Search ............ 438/618, 438/623, 627, 622, 761, 778, 780, 782, 790, 438/FOR. 385, FOR. 395, FOR. 135; 257/758, 257/759, 760, E21.575, E21.579, E21.584, 257/E51.046
See application file for complete search history.

(56) References Cited

U.S. PATENT DOCUMENTS

| | | | |
|---|---|---|---|
| 6,296,780 B1 * | 10/2001 | Yan et al. | 216/67 |
| 6,518,200 B2 * | 2/2003 | Lin | 438/761 |
| 2006/0154086 A1 * | 7/2006 | Fuller et al. | 428/428 |

* cited by examiner

*Primary Examiner* — Julio J Maldonado
*Assistant Examiner* — Quovaunda V Jefferson
(74) *Attorney, Agent, or Firm* — Ingrassia Fisher & Lorenz, P.C.

(57) ABSTRACT

A method of fabricating a semiconductor device is provided. The method begins by providing a semiconductor device structure having electronic devices formed on a semiconductor substrate, and having an upper metal layer associated with electrical contacts for the electronic devices. The method continues by forming a diffusion barrier layer overlying the upper metal layer. Next, the method deposits a first layer of graded ultra-low-k (ULK) material overlying the diffusion barrier layer, a layer of ULK material overlying the first layer of graded ULK material, and a second layer of graded ULK material overlying the layer of ULK material. The method continues by depositing a layer of low temperature oxide material overlying the second layer of graded ULK material, and forming a layer of metal hard mask material overlying the layer of low temperature oxide material.

18 Claims, 5 Drawing Sheets

US 8,183,149 B1

METHOD OF FABRICATING A CONDUCTIVE INTERCONNECT ARRANGEMENT FOR A SEMICONDUCTOR DEVICE

TECHNICAL FIELD

Embodiments of the subject matter described herein relate generally to the fabrication of semiconductor devices. More particularly, embodiments of the subject matter relate to the fabrication of a conductive interconnect arrangement for a semiconductor device.

BACKGROUND

The majority of present day integrated circuits (ICs) are implemented by using a plurality of interconnected field effect transistors (FETs), which may be realized as metal oxide semiconductor field effect transistors (MOSFETs or MOS transistors). A MOS transistor may be realized as a p-type device (i.e., a PMOS transistor) or an n-type device (i.e., an NMOS transistor). Moreover, a semiconductor device can include both PMOS and NMOS transistors, and such a device is commonly referred to as a complementary MOS or CMOS device. A MOS transistor includes a gate electrode as a control electrode that is formed over a semiconductor substrate, and spaced-apart source and drain regions formed within the semiconductor substrate and between which a current can flow. The source and drain regions are typically accessed via respective conductive contacts formed on the source and drain regions. Bias voltages applied to the gate electrode, the source contact, and the drain contact control the flow of current through a channel in the semiconductor substrate between the source and drain regions beneath the gate electrode. Conductive metal interconnects (plugs) formed in an insulating layer are typically used to deliver bias voltages to the gate, source, and drain contacts.

A conductive interconnect arrangement or architecture can be utilized to interconnect the many transistors that typically form an integrated circuit. Patterned metal layers, which are formed overlying the uppermost metal contact layer used to form the source, drain, and gate contacts of the transistors, are commonly used to create an interconnect arrangement. The different metal interconnect layers are separated by dielectric material (an interlayer dielectric or ILD). At a given interconnect level, patterned trenches are filled with conductive metal material to create the desired interconnect routing. Conductive plugs (typically formed from a tungsten-based material) are used to establish electrical contact between an interconnect trace to an underlying doped region, gate electrode, or lower interconnecting level.

Interconnect structures are often created with insulating materials having very low dielectric constants (e.g., ultra-low-k (ULK) materials). ULK materials are desirable to reduce capacitive coupling between neighboring conductive layers or structures. Unfortunately, existing processes for creating interconnect structures with ULK material can be time consuming, costly, and overly complex.

Accordingly, it is desirable to have an improved fabrication process that can be used to create an interconnect arrangement for a semiconductor device in an efficient, simple, and economical manner. Furthermore, other desirable features and characteristics will become apparent from the subsequent detailed description and the appended claims, taken in conjunction with the accompanying drawings and the foregoing technical field and background.

BRIEF SUMMARY

A method of fabricating a semiconductor device is provided, where the semiconductor device includes transistor devices formed on a semiconductor substrate, and an upper metal layer that provides electrical contacts for the transistor devices. The method involves forming a diffusion barrier layer overlying the upper metal layer, depositing a lower graded layer overlying the diffusion barrier layer, depositing a layer of dielectric material overlying the lower graded layer, and depositing an upper graded layer overlying the layer of dielectric material. The steps of depositing the lower graded layer, depositing the layer of dielectric material, and depositing the upper graded layer are performed in-situ within a common deposition chamber.

Another method of fabricating a semiconductor device is provided. The method provides a semiconductor device structure having electronic devices formed on a semiconductor substrate, and having an upper metal layer associated with electrical contacts for the electronic devices. The method continues by forming a diffusion barrier layer overlying the upper metal layer, depositing a first layer of graded ultra-low-k (ULK) material overlying the diffusion barrier layer, depositing a layer of ULK material overlying the first layer of graded ULK material, and depositing a second layer of graded ULK material overlying the layer of ULK material. The method then deposits a layer of low temperature oxide material overlying the second layer of graded ULK material, and forms a layer of metal hard mask material overlying the layer of low temperature oxide material.

A method of fabricating a conductive interconnect arrangement for a semiconductor device structure is also provided. The device structure includes electronic devices formed on a semiconductor substrate, an upper metal layer associated with electrical contacts for the electronic devices, and a diffusion barrier layer overlying the upper metal layer. The method involves depositing an oxide adhesion layer overlying the diffusion barrier layer using a first chemical precursor gas flow in a deposition chamber, depositing a first layer of graded ultra-low-k (ULK) material overlying the oxide adhesion layer by transitioning from the first chemical precursor gas flow to a second chemical precursor gas flow in the deposition chamber, depositing a layer of ULK material overlying the first layer of graded ULK material using the second chemical precursor gas flow in the deposition chamber, and depositing a second layer of graded ULK material overlying the layer of ULK material by terminating the second chemical precursor gas flow in the deposition chamber in a transient manner.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well known process details.

The techniques and technologies described herein may be utilized to fabricate a conductive interconnect arrangement or architecture for a semiconductor device having one or more transistor devices, typically, metal-oxide-semiconductor (MOS) transistor devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
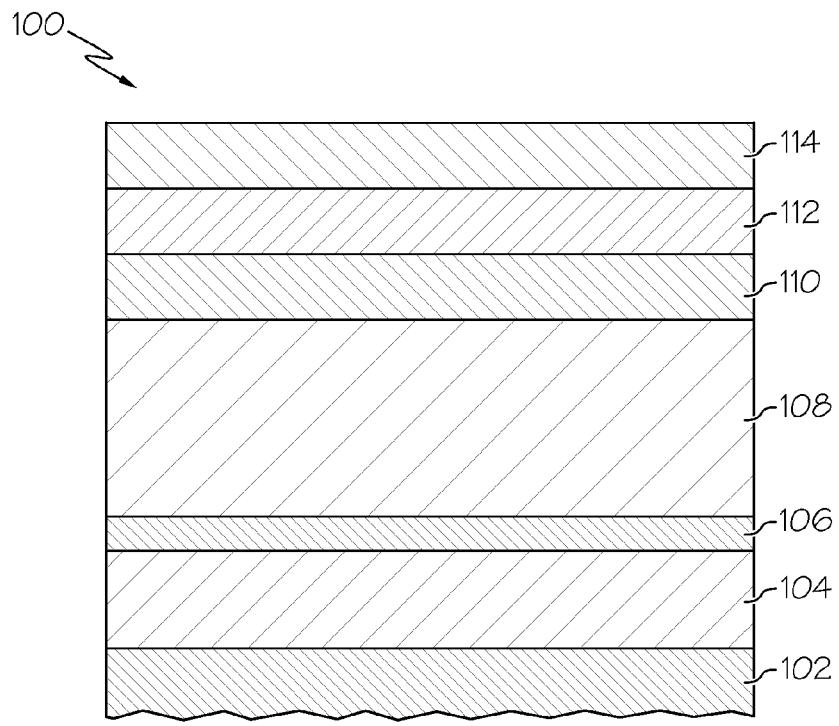
FIG. 1 is a cross-sectional view of a portion of a conventional semiconductor device structure, prior to formation of interconnect trenches.

FIG. 1 is a cross-sectional view of a portion of a conventional semiconductor device structure 100 in a state following typical front end processing, and prior to formation of interconnect trenches. In this regard, FIG. 1 depicts an intermediate state in the overall fabrication process. The front end processing results in one or more transistor devices formed on a semiconductor substrate 102, which has an upper metal layer that is used to form electrical contacts for the transistor devices. FIG. 1 depicts the semiconductor device structure 100 after the following layers have been deposited or otherwise formed overlying the semiconductor substrate 102: a diffusion barrier layer 104; a graded dielectric layer 106; a layer of ultra-low-k (ULK) material 108; a first hard mask layer 110; a second hard mask layer 112; and a metal hard mask layer 114.

The diffusion barrier layer 104 serves as a diffusion barrier between the upper metal layer (usually copper) of the semiconductor substrate 102 and the overlying material. The graded dielectric layer 106 serves as a transition from the diffusion barrier layer 104 and the layer of ULK material 108. In this regard, the graded dielectric layer 106 may be referred to here as a layer of graded ULK material. For this example, the layer of ULK material 108 is a porous film having the appropriate composition. The first hard mask layer 110 and the second hard mask layer 112 are used to protect the underlying layer of ULK material 108 during subsequent process steps such as material deposition, photolithography, and etching. The metal hard mask layer 114 will typically be formed from a titanium nitride material.

Figure 2:
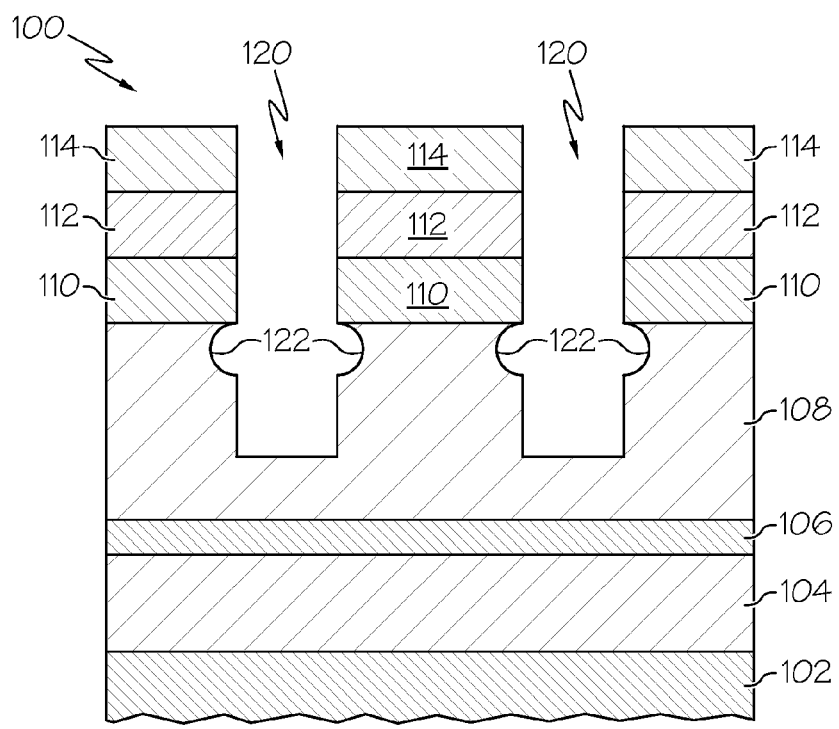
FIG. 2 is a cross-sectional view of the portion of the conventional semiconductor device structure shown in FIG. 1, after formation of interconnect trenches.

FIG. 2 is a cross-sectional view of the portion of the conventional semiconductor device structure 100, after formation of interconnect trenches 120. Due to the combination of the first hard mask layer 110, the second hard mask layer 112, and the metal hard mask layer 114, it can be difficult to facet the resulting interconnect trenches 120 in a way that accommodates deposition of conductive material in the interconnect trenches 120. The undercut features 122 below the first hard mask layer 110 are formed due to the different wet etch rates of the various films. The presence of the undercut features 122 make it challenging to efficiently and effectively fill the interconnect trenches with the desired conductive interconnect material. Moreover, this particular hard mask strategy is costly and it requires two distinct ex-situ hard mask deposition steps on two different deposition tool platforms.

The manufacturing techniques and processes described here can be employed to simplify the hard mask film stack by utilizing a porous ULK film with an in-situ dense termination layer and low temperature oxide (LTO) for profile control. In comparison to the conventional technique described above, the approach presented here eliminates one of the hard mask layers and, therefore, reduces the total hard mask thickness, resulting in a reduction in the aspect ratio of the formed trenches.

Figure 3:
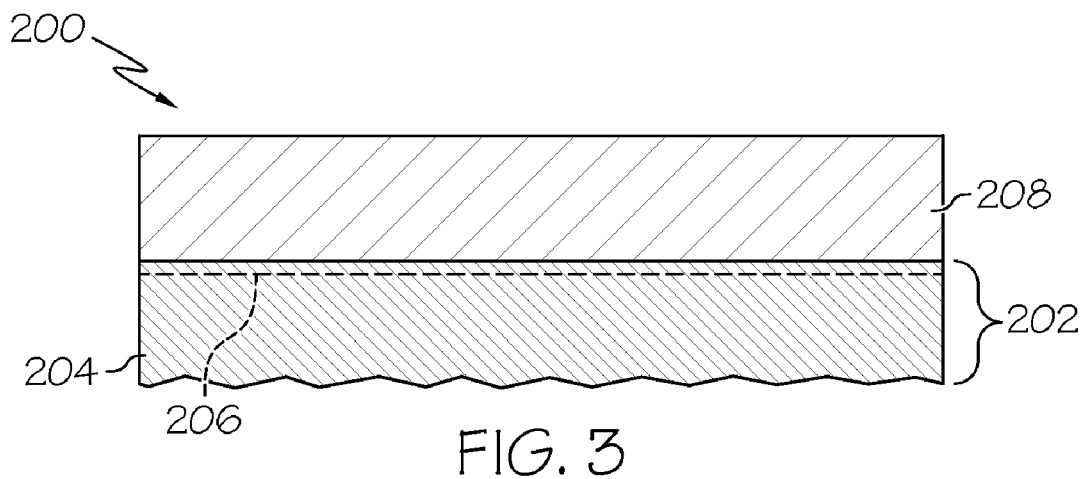
FIGS. 3-10 are cross-sectional views that illustrate the formation of a conductive interconnect arrangement for a semiconductor device.

FIGS. 3-10 are cross-sectional views that illustrate the formation of a conductive interconnect arrangement for a semiconductor device 200. FIG. 3 depicts an intermediate state in the overall fabrication process after formation of a semiconductor device structure 202 having electronic devices (e.g., transistors) formed on a semiconductor substrate 204, and having an upper metal layer 206 associated with electrical contacts for the electronic devices. The upper metal layer 206 is depicted in dashed lines because it need not appear as a continuous line in cross-section. Indeed, the upper metal layer 206 may include a variety of separate features such as conductive traces, contact pads, conductive lines, etc. After the appropriate front end processing, the semiconductor device structure 202 can be provided to complete the desired conductive interconnect arrangement, conductive plugs, and the like.

FIG. 3 depicts the state of the semiconductor device 200 after formation of a diffusion barrier layer 208 overlying the upper metal layer 206. The diffusion barrier layer 208 serves as a diffusion barrier for the upper metal layer 206. For this particular example, the upper metal layer 206 is formed using copper. Therefore, the composition of the diffusion barrier layer 208 is selected such that it serves as a copper diffusion barrier. In particular embodiments, the diffusion barrier layer 208 is formed from a nitrogen doped barrier low-k (NBLOK) material, although other suitable materials can be used. The diffusion barrier layer 208 is formed using an appropriate deposition technique such as chemical vapor deposition (CVD), plasma enhanced chemical vapor deposition (PECVD), or the like. The diffusion barrier layer 208 is typically deposited to a thickness within the range of about 20 nm to about 100 nm.

Figure 4:
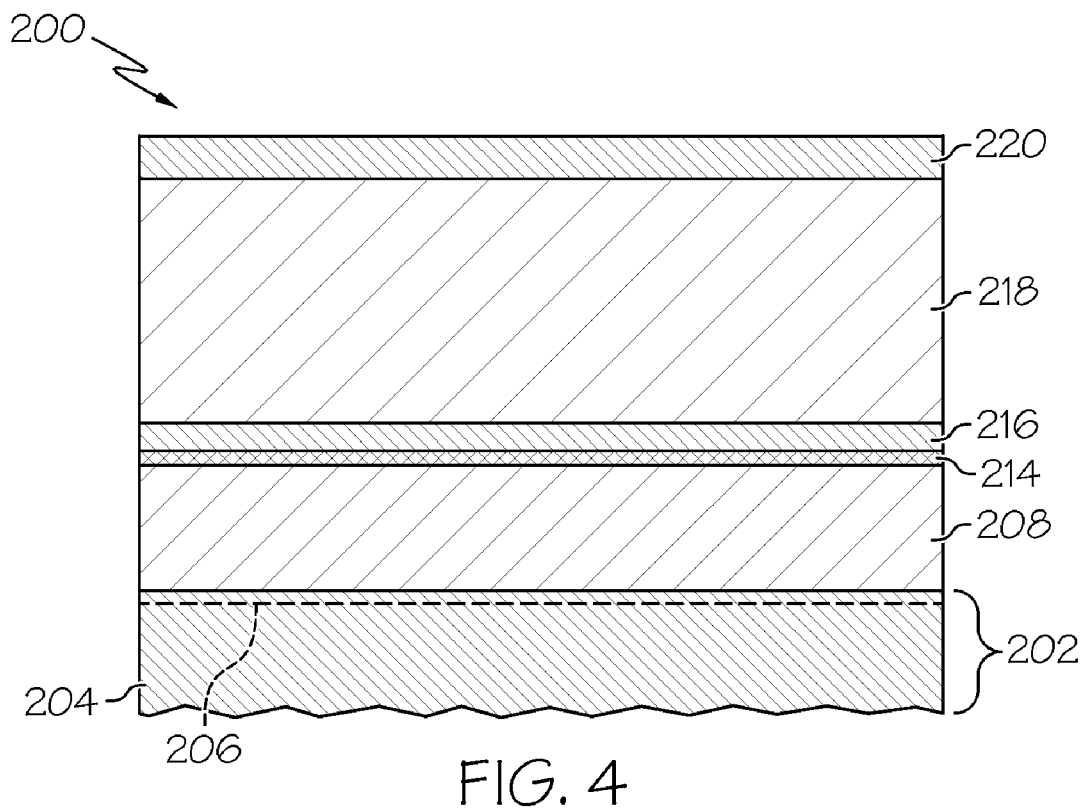

Although other fabrication steps or sub-processes may be performed after the step in the process depicted in FIG. 3, this example continues by forming multiple "layers" overlying the diffusion barrier layer 208. The various layers are shown in FIG. 4. More specifically, the fabrication process deposits an oxide adhesion layer 214 overlying the diffusion barrier layer 208, deposits a first (lower) layer of graded material 216 overlying the oxide adhesion layer, deposits a layer of ULK material 218 overlying the first layer of graded material 216, and deposits a second (upper) layer of graded material 220 overlying the layer of ULK material 218. In certain preferred embodiments, these four layers are deposited in-situ within a common (i.e., the same) deposition chamber of a suitable deposition tool or system. In other words, the wafer on which the semiconductor device 200 is formed remains in place within the deposition chamber, and the oxide adhesion layer 214, the first layer of graded material 216, the layer of ULK material 218, and the second layer of graded material 220 are formed in a substantially continuous and sequential manner by transitioning the parameters, characteristics, controls, and/or settings of the deposition tool.

For the embodiment described here, the oxide adhesion layer 214, the first layer of graded material 216, the layer of ULK material 218, and the second layer of graded material 220 are deposited using an appropriate technique such as CVD, PECVD, or a spin-on process. Accordingly, the oxide adhesion layer 214 is formed by placing the wafer into the deposition chamber, controlling the temperature, and introducing the appropriate source gas (i.e., a first chemical precursor gas flow) into the deposition chamber. The first chemical precursor gas flow is, therefore, associated with the formation of the oxide adhesion layer 214. The oxide adhesion layer 214 is usually deposited to a thickness within the range of about 2 nm to about 10 nm. The oxide adhesion layer 214 is typically composed of silicon dioxide, which serves as a good adhesion material for the underlying diffusion barrier layer 208.

After the desired thickness of the oxide adhesion layer 214 has been reached, the process continues by switching or transitioning from the first chemical precursor gas flow to a second chemical precursor gas flow that is associated with the deposition of the layer of ULK material 218. The transition from the first chemical precursor gas flow to the second chemical precursor gas flow promotes the deposition of the ULK material 218 (instead of oxide). The temperature and/or other deposition control parameters may also be adjusted or changed if needed to promote the deposition of the ULK material 218. Notably, the first layer of graded material 216 is deposited during this transition period, i.e., between the deposition of the oxide adhesion layer 214 and the layer of ULK material 218. In this regard, the first layer of graded material 216 is inherently formed as the composition of the source gas is gradually changed. Consequently, the first layer of graded material 216 may be considered to be a layer of graded ULK material. In practice, the "blended" characteristics of the first layer of graded material 216 further enhance the adhesion between the layer of ULK material 218 and the diffusion barrier layer 208. The first layer of graded material 216 is usually deposited to a thickness within the range of about 10 nm to about 50 nm.

After the desired thickness of the first layer of graded material 216 has been deposited, the second chemical precursor gas flow is maintained such that the layer of ULK material 218 is deposited. The layer of ULK material 218 is preferably realized using a porous organosilicate glass material composed of silicon, carbon, oxygen, and hydrogen. Such ULK materials are commonly used in the semiconductor industry, and the particular type of dielectric material used for the layer of ULK material 218 may vary from one embodiment to another.

Deposition of the layer of ULK material 218 continues until the desired thickness has been achieved, typically within the range of about 100 nm to about 600 nm. Thereafter, the second layer of graded material 220 is deposited by transitioning from the second chemical precursor gas flow to a different gas flow state. For this particular example, the second chemical precursor gas flow is gradually terminated, resulting in a terminated chemical precursor gas flow state. In other words, the flow of the second chemical precursor gas ("porogen") is "shut off" in a transient manner to ultimately terminate the material deposition process. In practice, the precursor has some residence time in the gas line (e.g., from the shutoff valve to the chamber) and in the chamber itself, which results in its gradual termination. In addition to this gas flow transition, the radio frequency (RF) power in the deposition chamber is scaled (e.g., reduced to a lower set point) to accomplish the desired characteristics of the second layer of graded material 220. Notably, the second layer of graded material 220 is deposited during this transient shut down period, i.e., after the deposition of the "pure" layer of ULK material 218. In this regard, the second layer of graded material 220 is inherently formed as the second chemical precursor gas flow is terminated. Consequently, the second layer of graded material 216 may be considered to be a layer of graded ULK material. The second layer of graded material 220 is typically deposited to a thickness within the range of about 5 nm to about 15 nm.

Notably, the second layer of graded material 220 is used instead of two distinct hard mask dielectric layers (which would require two separate deposition steps). In this regard, the second layer of graded material 220 is realized as an in-situ dense termination layer that acts as a protective film for the underlying layer of ULK material 218. This in-situ dense termination layer is fabricated by turning off the porogen chemical precursor flow a few seconds before the end of the deposition process depicted in FIG. 4, and it is formed overlying the bulk ULK film without requiring an air break. Accordingly, the deposition of the porous layer of ULK material and the dense termination layer are accomplished in-situ within the same process chamber. In this regard, the layer of ULK material 218 and the second layer of graded material 220 are actually formed in a single step. Indeed, the oxide adhesion layer 214, the first layer of graded material 216, the layer of ULK material 218, and the second layer of graded material 220 are all formed during the same process step, using different deposition control settings and gas flows.

Figure 5:
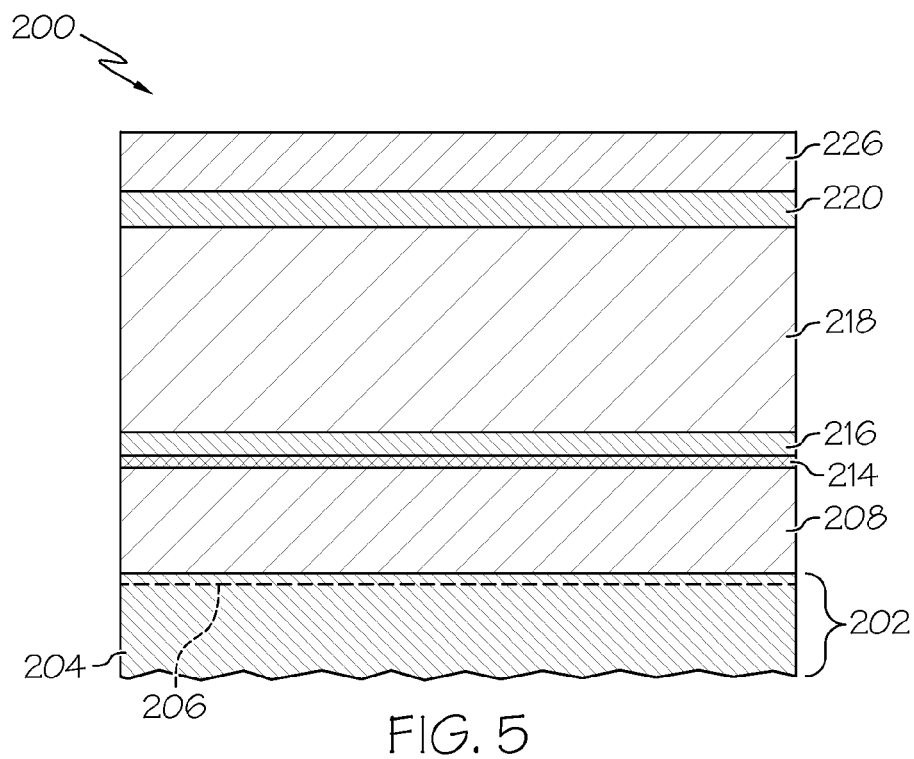

Although other fabrication steps or sub-processes may be performed after the formation of the second layer of graded material 220, this example continues by forming a layer of low temperature oxide (LTO) material 226 overlying the second layer of graded material 220 (see FIG. 5). The layer of LTO material 226 is typically deposited using a different tool than that used for the previous "combined" deposition step, due to the use of different process gases and temperatures. The layer of LTO material 226 is deposited using, for example, CVD, PECVD, or the like, at a relatively low temperature (about 200 degrees Celsius). The layer of LTO material 226 is typically deposited to a thickness within the range of about 20 nm to about 40 nm. For this example, the layer of LTO material 226 is composed of silicon dioxide, as is well understood. Silicon dioxide is utilized here to avoid resist poisoning, i.e., to reduce the amount of gas that migrates into photoresist material used in subsequent photolithography process steps. Although the layer of LTO material 226 is denser than the underlying second layer of graded material 220 and the layer of ULK material 218, it is less dense than traditional hard mask materials. The relatively low density of the layer of LTO material 226 (compared to other materials that are traditionally used for hard mask layers) is desirable for ease of etching and to promote the formation of angled trench sidewalls (as described in more detail below). Moreover, because the layer of LTO material 226 is deposited using a low temperature process, and because it is deposited overlying the second layer of graded material 220, it is not damaging or otherwise detrimental to the underlying layer of ULK material 218.

Figure 6:
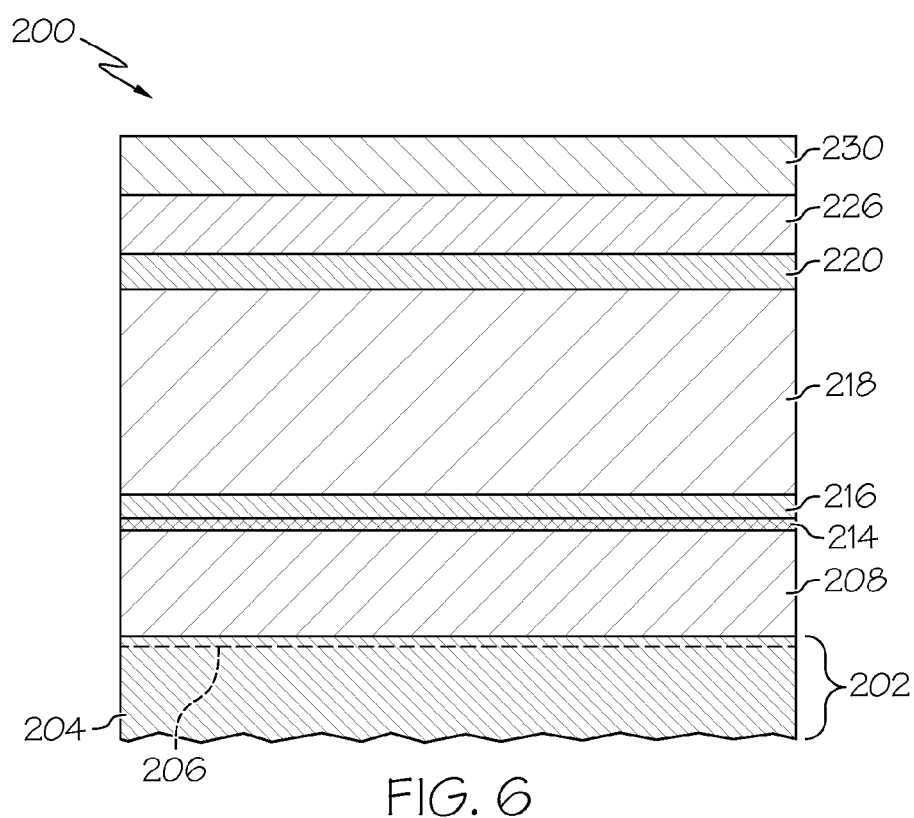

Although other fabrication steps or sub-processes may be performed after the formation of the layer of LTO material 226, this example continues by forming a layer of metal hard mask material 230 overlying the layer of LTO material 226 (see FIG. 6). The layer of metal hard mask material 230 is typically deposited using a different tool than that used for the deposition of the layer of LTO material 226. In this regard, the layer of metal hard mask material 230 is deposited using, for example, physical vapor deposition (PVD). In certain embodiments, the layer of metal hard mask material 230 is deposited to a thickness within the range of about 25 nm to about 50 nm. For this example, the layer of metal hard mask material 230 includes a titanium nitride material, although other suitable metal materials could be used.

Figure 7:
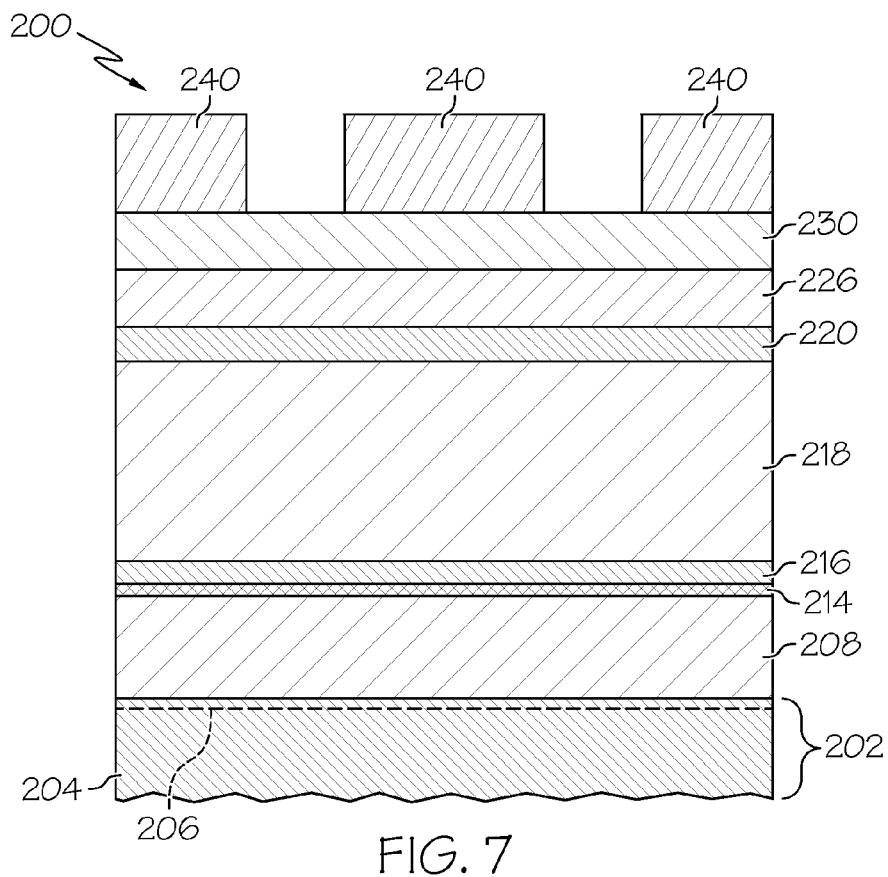

Although other fabrication steps or sub-processes may be performed after the formation of the layer of metal hard mask material 230, this example continues by creating a patterned etch mask 240 overlying the layer of metal hard mask material 230 (see FIG. 7). The patterned etch mask 240 may be formed using well known process steps associated with the deposition of photoresist material, the exposure and development of the photoresist material, etching, etc. The patterned etch mask 240 includes features that protect certain portions of the underlying layer of metal hard mask material 230, and openings that expose other portions of the layer of metal hard mask material 230. Conventional photolithographic techniques and other conventional process steps related to the fabrication of the patterned etch mask 240 will not be described in detail here.

Figure 8:
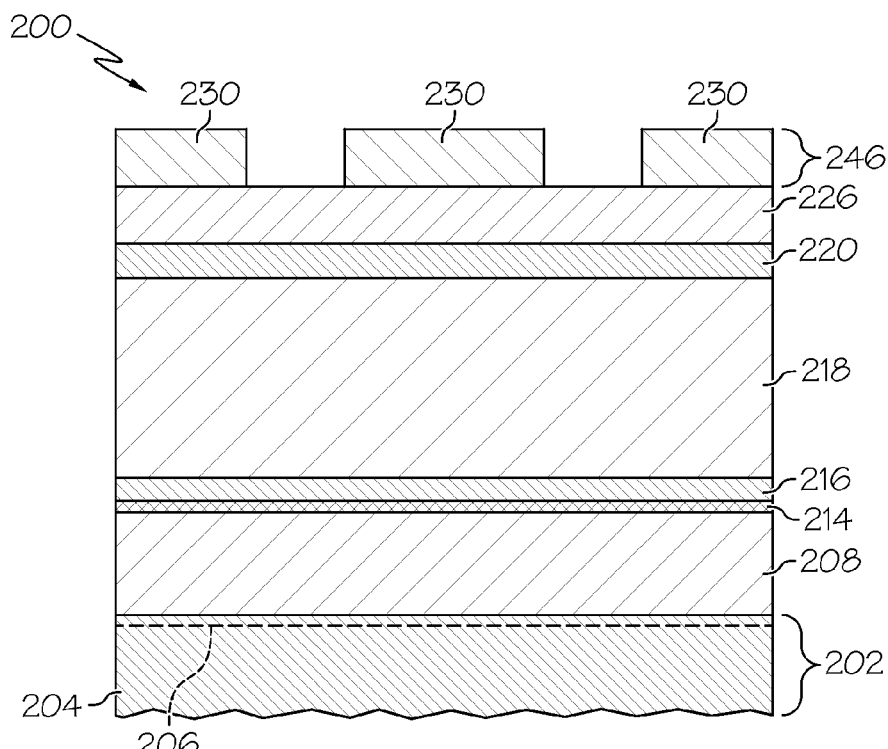
Figure 9:
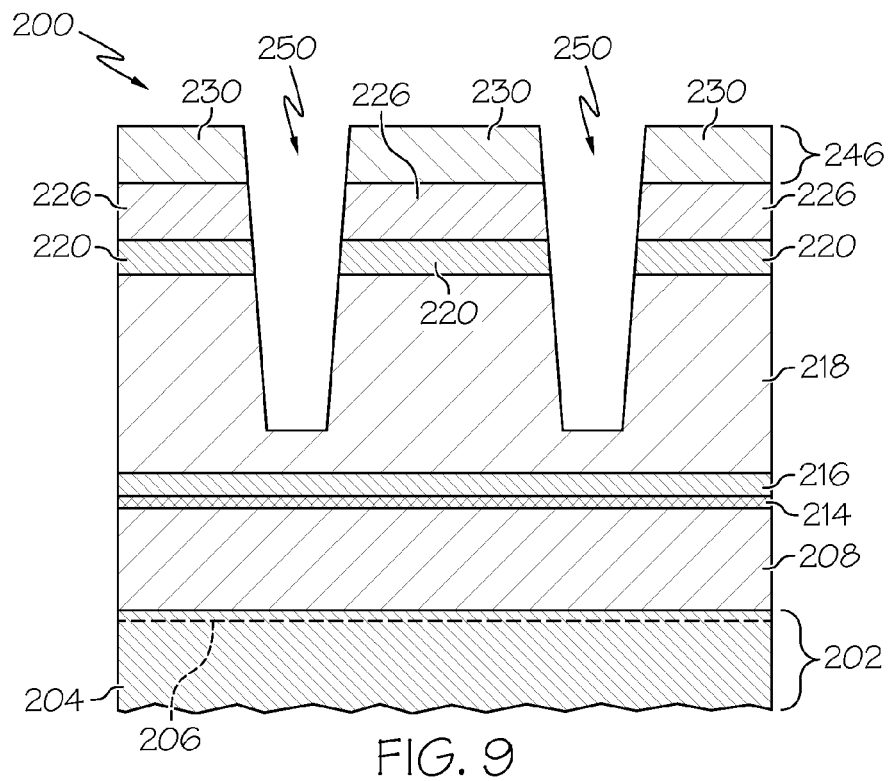

Next, the layer of metal hard mask material 230 is selectively etched into the pattern defined by the patterned etch mask 240. In this regard, FIG. 8 depicts the state of the semiconductor device 200 after the layer of metal hard mask material 230 has been etched and after the patterned etch mask has been removed. As shown in FIG. 8, a portion of the layer of metal hard mask material 230 is removed by etching to create a patterned hard mask 246 overlying the layer of LTO material 226. After the patterned hard mask 246 has been created, the process may continue by etching the layer of LTO material 226, the second layer of graded material 220, and the layer of ULK material 218 using the patterned hard mask 246 as the etch mask (see FIG. 9). In practice, these layers could be etched in a single step using only one etching technique and only one etch chemistry, or they could be etched in multiple steps using different etching techniques and different etch chemistries. The etching of these layers results in the formation of interconnect trenches 250 for the semiconductor device 200. Although exaggerated in FIG. 9, the interconnect trenches 250 exhibit faceted profiles (i.e., angled interior sidewalls), wherein the top openings of the interconnect trenches 250 are wider than the lower sections of the interconnect trenches 250. The use of the LTO material overlying the second layer of graded material 220 promotes the formation of this angled trench profile. Moreover, the interconnect trenches 250 do not exhibit any appreciable undercut below the layer of LTO material 226 (in comparison, see the undercut features 122 depicted in FIG. 2). The lack of undercut features can be attributed to the use of the single layer of LTO material 226 rather than two different hard mask layers having different wet etch rates. The tapered profile and lack of undercutting in the interconnect trenches 250 are desirable for purposes of filling the interconnect trenches 250.

Figure 10:
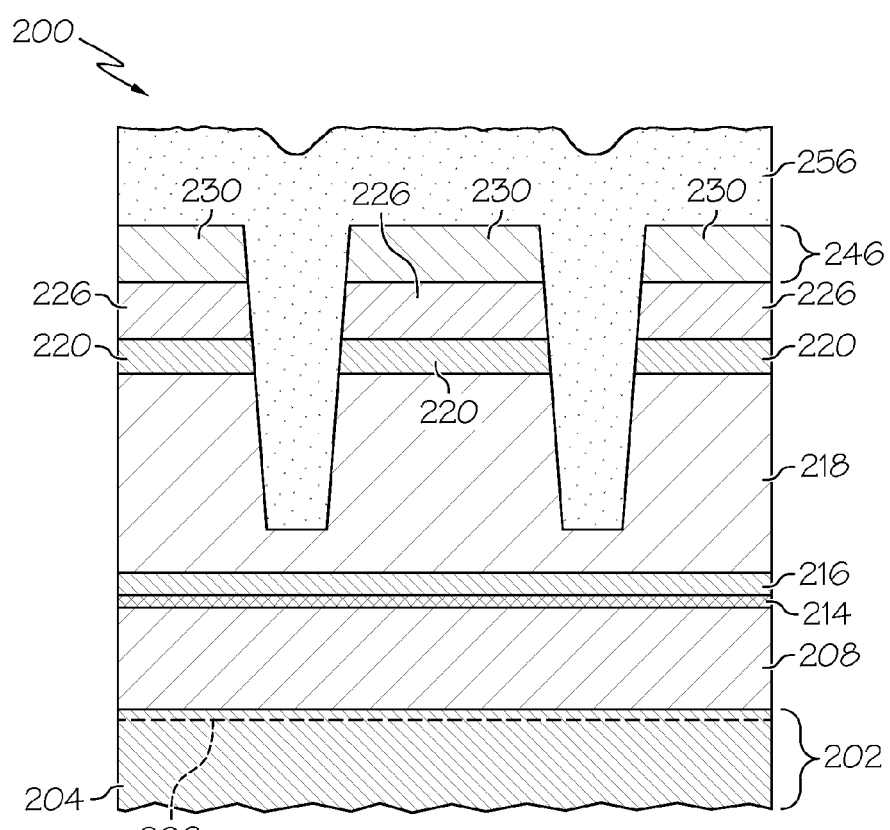

Although other fabrication steps or sub-processes may be performed after the formation of the interconnect trenches 250, this example continues by filling the interconnect trenches 250 with conductive interconnect material 256 (see FIG. 10). The conductive interconnect material 256 (which may be, for example, a copper material or any common interconnect material used in the semiconductor industry) can be formed using an appropriate technique. For example, copper material could be formed by a plating process. As depicted in FIG. 10, the conductive interconnect material 256 can be formed such that it completely fills the interconnect trenches 250, and such that excess material overlies the patterned hard mask 246. Thereafter, a number of conventional process steps can be performed to complete the interconnect arrangement of the semiconductor device 200. For example, chemical mechanical polishing can be performed to remove the overburden portion of the conductive interconnect material 256. In addition, one or more additional polishing or planarizing steps could be performed to remove some or all of the patterned hard mask 246, some or all of the layer of LTO material 226, some or all of the second layer of graded material 220, etc. Thereafter, fabrication of the semiconductor device 200 can be completed in an ordinary and conventional manner.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of fabricating a semiconductor device having transistor devices formed on a semiconductor substrate, and having an upper metal layer that provides electrical contacts for the transistor devices, the method comprising:

forming a diffusion barrier layer overlying the upper metal layer;

depositing a lower layer of graded material overlying the diffusion barrier layer by transitioning from a first chemical precursor gas flow to a second chemical precursor gas flow in a common deposition chamber;

depositing a layer of dielectric material overlying the lower layer of graded material by using the second chemical precursor gas flow in the common deposition chamber; and depositing an upper layer of graded material overlying the layer of dielectric material by terminating the second chemical precursor gas flow in the common deposition chamber in a transient manner, depositing the lower layer of graded material, depositing the layer of dielectric material, and depositing the upper layer of graded material being performed in-situ within the common deposition chamber.

2. The method of claim 1, the layer of dielectric material comprising an ultra-low-k dielectric material.

3. The method of claim 1, further comprising depositing a layer of low temperature oxide material overlying the upper layer of graded material.

4. The method of claim 3, further comprising forming a layer of metal hard mask material overlying the layer of low temperature oxide material.

5. The method of claim 4, the layer of metal hard mask material comprising a titanium nitride material.

6. The method of claim 4, further comprising removing a portion of the layer of metal hard mask material to create a patterned hard mask overlying the layer of low temperature oxide material.

7. The method of claim 6, further comprising etching the layer of low temperature oxide material, the upper layer of graded material, and the layer of dielectric material using the patterned hard mask as an etch mask, resulting in interconnect trenches for the semiconductor device.

8. The method of claim 7, further comprising filling the interconnect trenches with conductive interconnect material.

9. A method of fabricating a semiconductor device, the method comprising:
provide a semiconductor device structure having electronic devices formed on a semiconductor substrate, and having an upper metal layer associated with electrical contacts for the electronic devices;
forming a diffusion barrier layer overlying the upper metal layer;
depositing an oxide adhesion layer overlying the diffusion barrier layer in an in-situ manner within a common deposition chamber;
after depositing the oxide adhesion layer, depositing, in-situ within the common deposition chamber, a first layer of graded ultra-low-k (ULK) material overlying the diffusion barrier layer, wherein depositing the first layer of graded ULK material comprises transitioning from a first chemical precursor gas flow to a second chemical precursor gas flow in the common deposition chamber, wherein the first chemical precursor gas flow is associated with formation of the oxide adhesion layer, and wherein the second chemical precursor gas flow is associated with formation of the layer of ULK material;
depositing, in-situ within the common deposition chamber, a layer of ULK material overlying the first layer of graded ULK material;
depositing, in-situ within the common deposition chamber, a second layer of graded ULK material overlying the layer of ULK material;
depositing a layer of low temperature oxide material overlying the second layer of graded ULK material; and
forming a layer of metal hard mask material overlying the layer of low temperature oxide material.

10. The method of claim 9, depositing the second layer of graded ULK material comprising transitioning from the second chemical precursor gas flow to a terminated chemical precursor gas flow state.

11. The method of claim 9, further comprising:
selectively etching the layer of metal hard mask material to create a patterned hard mask overlying the layer of low temperature oxide material; and
etching the layer of low temperature oxide material, the second layer of graded ULK material, and the layer of ULK material using the patterned hard mask as an etch mask, resulting in interconnect trenches for the semiconductor device.

12. The method of claim 11, further comprising filling the interconnect trenches with conductive interconnect material.

13. A method of fabricating a conductive interconnect arrangement for a semiconductor device structure having electronic devices formed on a semiconductor substrate, an upper metal layer associated with electrical contacts for the electronic devices, and a diffusion barrier layer overlying the upper metal layer, the method comprising:
depositing an oxide adhesion layer overlying the diffusion barrier layer using a first chemical precursor gas flow in a deposition chamber;
depositing a first layer of graded ultra-low-k (ULK) material overlying the oxide adhesion layer by transitioning from the first chemical precursor gas flow to a second chemical precursor gas flow in the deposition chamber;
depositing a layer of ULK material overlying the first layer of graded ULK material using the second chemical precursor gas flow in the deposition chamber; and
depositing a second layer of graded ULK material overlying the layer of ULK material by terminating the second chemical precursor gas flow in the deposition chamber in a transient manner.

14. The method of claim 13, further comprising:
depositing a layer of low temperature oxide material overlying the second layer of graded ULK material; and
forming a layer of metal hard mask material overlying the layer of low temperature oxide material.

15. The method of claim 14, further comprising:
selectively etching the layer of metal hard mask material to create a patterned hard mask overlying the layer of low temperature oxide material; and
etching the layer of low temperature oxide material, the second layer of graded ULK material, and the layer of ULK material using the patterned hard mask as an etch mask, resulting in interconnect trenches for the semiconductor device structure.

16. The method of claim 15, further comprising filling the interconnect trenches with conductive interconnect material.

17. The method of claim 13, depositing the second layer of graded ULK material accomplished by scaling radio frequency (RF) power in the deposition chamber.

18. The method of claim 17, depositing the second layer of graded ULK material accomplished by reducing the RF power in the deposition chamber.

* * * * *